United States Patent [19]

Camarota et al.

[11] Patent Number: 5,218,240
[45] Date of Patent: Jun. 8, 1993

[54] PROGRAMMABLE LOGIC CELL AND ARRAY WITH BUS REPEATERS

[75] Inventors: Rafael C. Camarota, San Jose; Frederick C. Furtek, Menlo Park; Walford W. Ho; Edward H. Browder, both of Saratoga, all of Calif.

[73] Assignee: Concurrent Logic, Inc., Sunnyvale, Calif.

[21] Appl. No.: 935,116

[22] Filed: Aug. 25, 1992

Related U.S. Application Data

[62] Division of Ser. No. 608,415, Nov. 2, 1990, Pat. No. 5,144,166.

[51] Int. Cl.⁵ ......................................... H03K 19/177
[52] U.S. Cl. .................................. 307/443; 307/465.1; 307/481
[58] Field of Search ............... 307/443, 243, 465, 469, 307/465.1, 303.2, 468, 481; 340/825.83, 825.87, 825.91

[56] References Cited

U.S. PATENT DOCUMENTS

| | | | |
|---|---|---|---|
| 4,642,487 | 2/1987 | Carter | 307/465 |
| 4,786,904 | 11/1988 | Graham, III et al. | 307/465 X |
| 4,812,684 | 3/1989 | Yamagiwa et al. | 307/481 X |
| 4,855,619 | 8/1989 | Hsieh et al. | 307/443 |
| 4,912,342 | 3/1990 | Wang et al. | 307/481 X |
| 4,918,641 | 4/1990 | Tigour et al. | 307/465 X |
| 5,073,729 | 12/1991 | Greene et al. | 307/465.1 |

Primary Examiner—David R. Hudspeth
Attorney, Agent, or Firm—Pennie & Edmonds

[57] ABSTRACT

A programmable logic array comprising cells and a bus network in which the cells are arranged in a two-dimensional matrix of rows and columns and are interconnected by the bus network. The cells are also interconnected by a two-dimensional array of direct connections between a cell and its four nearest neighbors, one to its left (or to the West), one to its right (or to the East), one above it (or to the North) and one below it (or to the South). Each cell comprises eight inputs, eight outputs, means for multiplexing the eight inputs onto two leads and logic means that operate in response to the signals on the two leads to produce output signals which are applied to the eight outputs. The bus network comprises a local, a turning and an express bus for each row and column of the array and repeater means for partitioning said buses of a given row or column so as to form bus segments. The bus network provides for transfer of data to the cells of the array without using the cells as individual wires.

11 Claims, 11 Drawing Sheets

PROGRAMMABLE LOGIC CELL AND ARRAY WITH BUS REPEATERS

CROSS REFERENCE TO RELATED PATENTS AND APPLICATIONS

This is a division of application Ser. No. 07/608,415, filed Nov. 2, 1990, now U.S. Pat. No. 5,144,166.

The following U.S. patents and applications are related and are incorporated herein by reference: U.S. Pat. No. 4,700,187 for "Programmable Asynchronous Logic Cell and Array", U.S. Pat. No. 4,918,440 for "Programmable Logic Cell and Array", application Ser. No. 07/378,106 filed Jul. 11, 1989 for "Programmable Logic Cell and Array" now U.S. Pat. No. 5,089,973, and application Ser. No. 07/427,160 filed Oct. 25, 1989 for "Programmable Logic Cell and Array" now U.S. Pat. No. 5,019,736.

FIELD OF THE INVENTION

This invention relates to the field of digital logic circuits and, more particularly, to programmable and reprogrammable logic devices.

BACKGROUND OF THE INVENTION

U.S. patent application Ser. No. 07/427,160, describes a two dimensional array of programmable logic cells. Each of these cells accepts two "A" inputs, one each from two of its nearest neighbor cells in the array and two "B" inputs, one each from the other two of its nearest neighbors. Each cell performs selected operations on one of the "A" inputs and one of the "B" inputs to generate outputs on two "A" outputs and two "B" outputs. There are exactly four unique combinations of inputs to (or outputs from) such cells, i.e., the "A" inputs can come from the nearest neighbor cells to (1) the North and East, (2) the North and West, (3) the South and East, or (4) the South and West and the "B" inputs come from the other two cells. The four cells having these four combinations of inputs are identified as cells 20A, 20B, 20C and 20D of FIGS. 1 and 2A–2D of the '160 application. As discussed in the '160 application, these four combinations of inputs can be recorded as four orientations of the cell. The limitations on the directions from which the inputs are received and the directions in which the outputs are sent impose severe design limitations on the use of such cells in an array of cells. If cells of only one type are used, signal propagation in the array can go in only one direction in each dimension. Alternatively, as shown in FIG. 1 of '160 application, the four cell types can be assembled into one array provide for signal flow in both directions in both dimensions. However, this arrangement tends to be inefficient in its use of cells.

One object of the present invention is to provide a logic cell for use in a programmable logic array, wherein each logic cell is functionally identical.

Another object of the present invention is to provide a means for transmitting data within the array by means other than the interconnection of individual logic cells so as to minimize the time required to transmit data within the array.

SUMMARY OF THE INVENTION

The present invention is an array of programmable logic cells. In a preferred embodiment, each logic cell has at least eight inputs, eight outputs, means for multiplexing the eight inputs onto two leads and logic means that operate in response to the signals on the two leads and control bits, to produce output signals which are applied to the eight outputs.

The logic cells of the array are arranged in a two-dimensional matrix such that each cell has four nearest-neighbor cells, one to its left (or to the West), one to its right (or to the East), one above it (or to the North) and one below it (or to the South). Signal flow is possible in both directions in both dimensions.

According to the present invention, the logic cells forming the two-dimensional array are the same. More specifically, in forming the two-dimensional matrix, the interconnection of every cell with each of its four neighboring cells is functionally identical. In each direction, the cell has two inputs and two outputs which are connected to the two outputs and two inputs of the nearest neighboring cell. Since the inputs and outputs are functionally identical on each side of the cell, every cell of the array has the same orientation.

In addition, the present invention provides a bus network for transmitting digital data within the array without requiring the individual cells to act as logical wires. The bus network has three types of programmable buses: a local bus, a turning bus and an express bus, whereby one of each bus type is provided for each row and column of the array. According to the present invention, the three buses of each row and column of the array are connected to repeaters so as to form bus segments, which span a plurality of cells. As a result, the repeaters partition the array into rectangular blocks of cells to form an arrangement that can be repeated indefinitely.

The array of the present invention also includes means for distributing independent timing signals to each column of cells of the basic array and means for transmitting digital data from either the basic array of cells or the bus network to an input/output port.

BRIEF DESCRIPTION OF THE DRAWINGS

These and other objects, features and advantages of the invention may be better understood by referring to the following detailed description, which should be read in conjunction with the accompanying drawing in which.

DETAILED DESCRIPTION OF THE DRAWINGS

Figure 1:
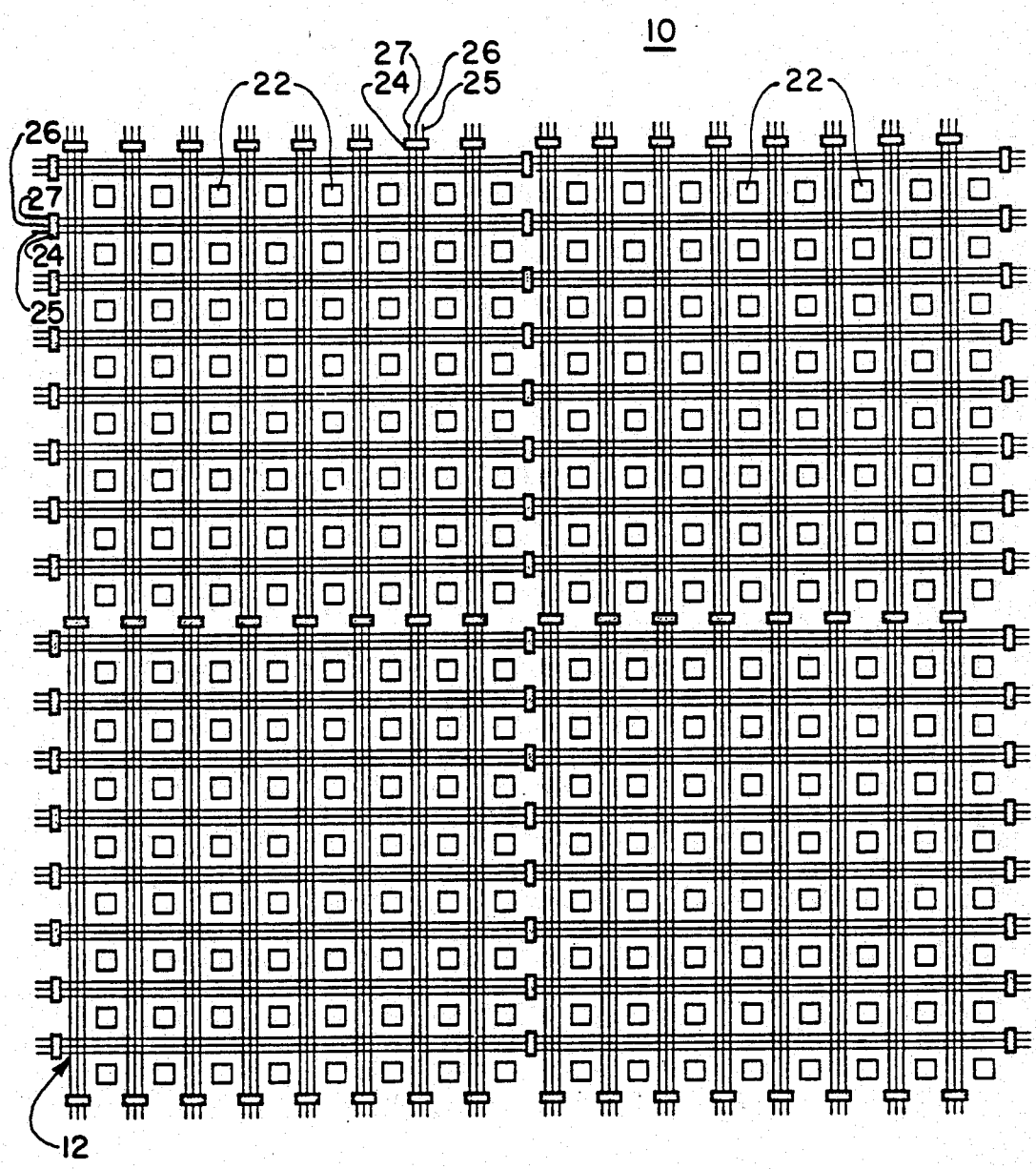
FIG. 1 is a schematic illustration of a preferred embodiment of the invention depicting an exemplary portion of an array of cells with a bus network superimposed on the array.

FIG. 1 depicts a programmable logic array 10 comprising cells 22 and a bus network 12 formed in accordance with the present invention. Cells 22 are arranged in a two-dimensional matrix of rows and columns and are interconnected by bus network 12 by connections not shown in FIG. 1. The cells are also interconnected by a two-dimensional array of direct connections between a cell and its four nearest neighbors, (i.e., the four cells immediately adjacent to the North, East, South and West). The bus network 12, which comprises repeaters 24 and vertical and horizontal buses 25, 26, 27, provides for the transfer of data within the array 10 without requiring individual cells 22 to act as logical wires.

Figure 2:
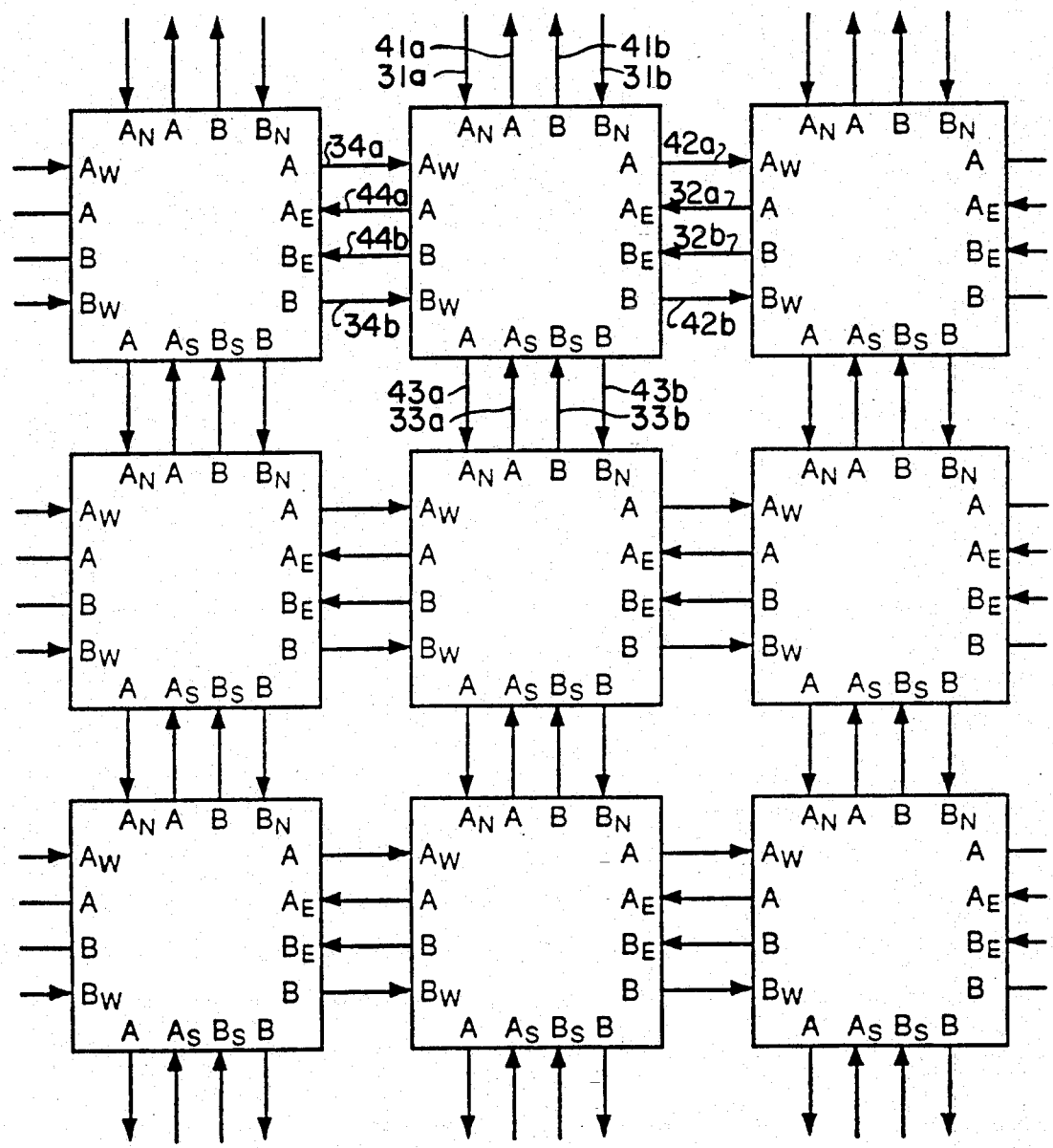
FIG. 2 is a diagrammatic illustration of an exemplary portion of the array of cells according to the present invention.

FIG. 2 depicts the direct interconnections within an exemplary portion of the array of cells 22 formed in accordance with the present invention. As is apparent, the cells are arranged in a two dimensional matrix with each cell having four nearest neighbors, one to its left (or to the West), one to its right (or to the East), one above it (or to the North) and one below it (or to the South). Each cell 22 has eight inputs 31a, 32a, 33a, 34a, 31b, 32b, 33b, 34b and eight outputs 41a, 42a, 43a, 44a, 41b, 42b, 43b, 44b. Each cell 22 is identical with respect to its direct connections to its four nearest neighbors. To each such neighbor, the cell provides two outputs and from each such neighbor the cell has two inputs. Cell inputs and outputs are divided into two categories "A" and "B", whereby each cell has an A input, an A output, a B input and a B output connected to each of its four nearest neighbors. Between adjacent cells, an A input is always connected to an A output and a B input is always connected to a B output.

Figure 3:
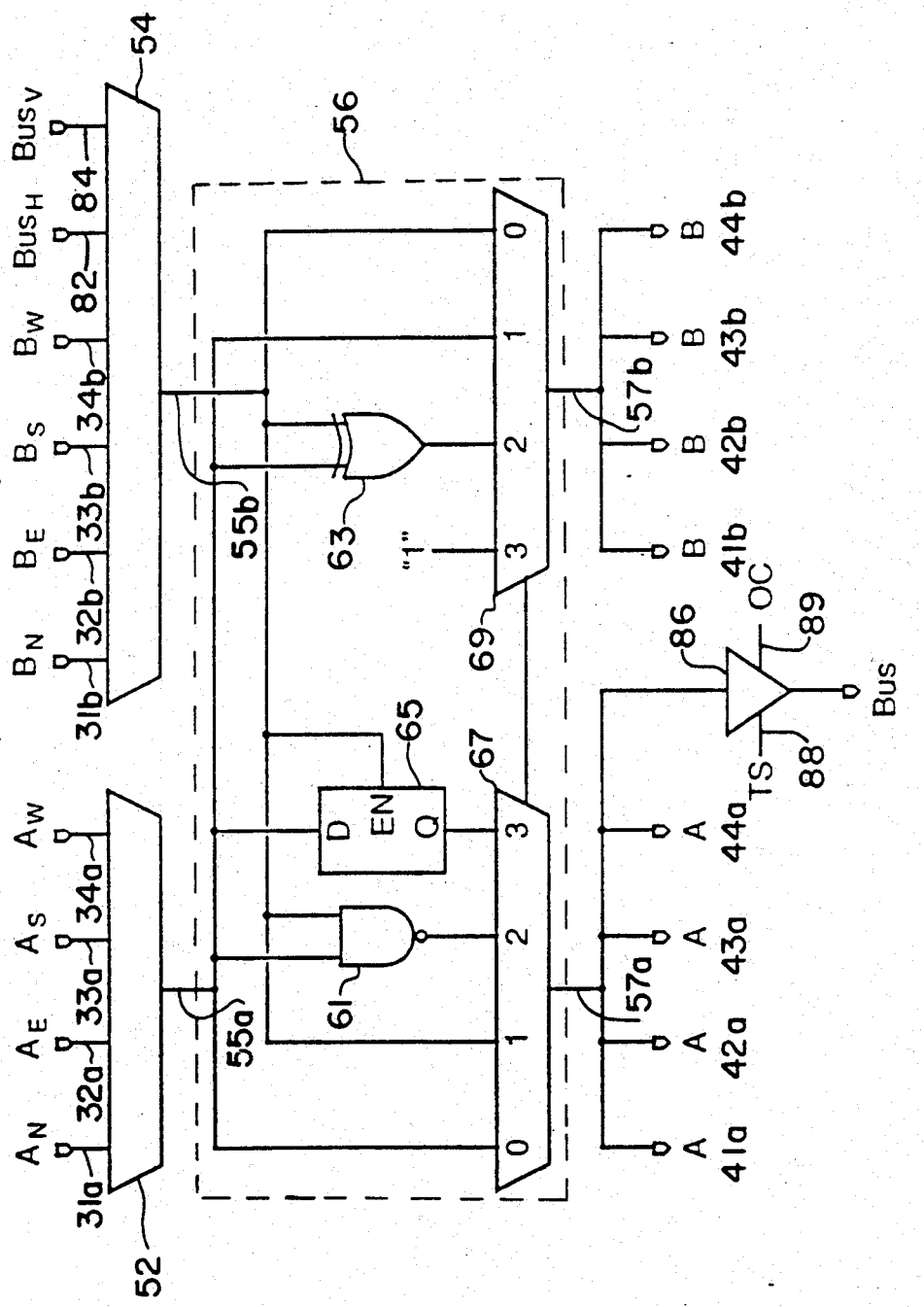
FIG. 3 is a block diagram depicting the internal structure of a cell of FIG. 2.

In an illustrative embodiment of cell 22 as shown in FIG. 3, the cell 22 comprises a four-to-one multiplexer 52, a six-to-one multiplexer 54 and a logic unit 56. Logic unit 56 can implement any one of a plurality of operations, such as, a direct wire, a switch, a logical NAND function, an exclusive OR function, a flip-flop or a logical constant. Each cell is controlled by eight configuration bits that are supplied to the cell by control lines (not shown) from a configuration control (not shown) such as a read/write memory. The configuration bits are used to specify which inputs are selected by multiplexers 52, 54 and which operation(s) is implemented by the logic unit. A clock signal is also provided to each cell by a clock signal line (not shown).

The four "A" inputs 31a, 32a, 33a, 34a are applied to multiplexer 52 and the four "B" inputs 31b, 32b, 33b, 34b are applied to multiplexer 54. As discussed below, two other inputs are applied to multiplexer 54 from vertical and horizontal lines 25 of the bus network. Multiplexer 52 connects one of the four "A" inputs to a lead 55a to logic unit 56. Similarly, multiplexer 54 connects one of the six "B" inputs to a lead 55b to logic unit 56. Each multiplexer 52, 54 is controlled separately by two and three configuration bits, respectively, so as to select one of its inputs. As a result, there are twenty-four possible combinations of inputs that can be applied to the logic unit 56 via leads 55a, 55b.

Logic unit 56 is a two-input, two-output device which selectively implements one of four possible combinations of operations as specified by two configuration bits. Logic unit 56 performs the selected operation on the input signals on leads 55a, 55b so as to generate output signals on leads 57a, 57b. The signal on lead 57a is applied to the "A" outputs 41a, 42a, 43a, 44a and the signal on lead 57b is applied to the B" outputs 41b, 42b, 43b, 44b. As discussed below, the signal on lead 57a can also be provided to the bus network via driver 86 under control of another configuration bit.

Figures 4A, 4B, 4C, 4D:
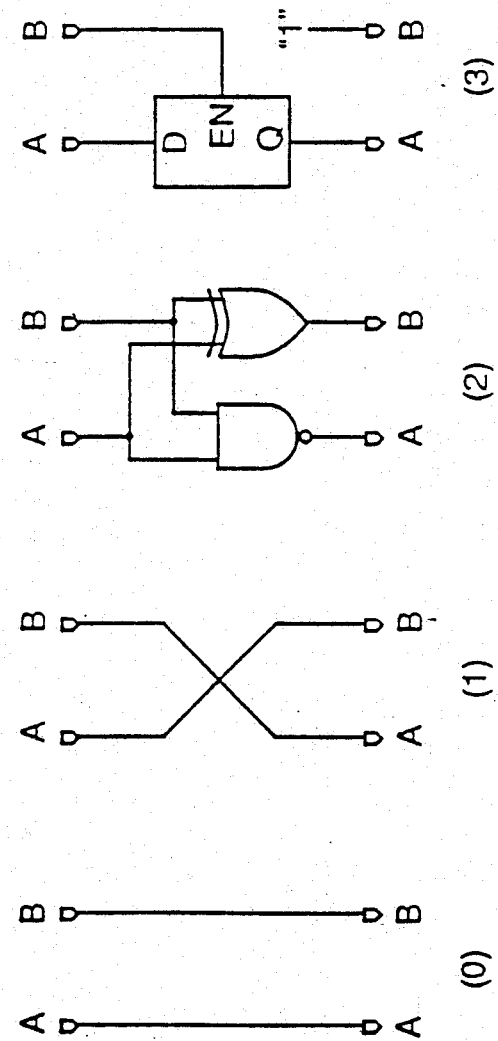
FIGS. 4A–4D are diagrammatic illustrations of a set of possible states of a logic means in a cell of FIG. 3.
Figure 10:
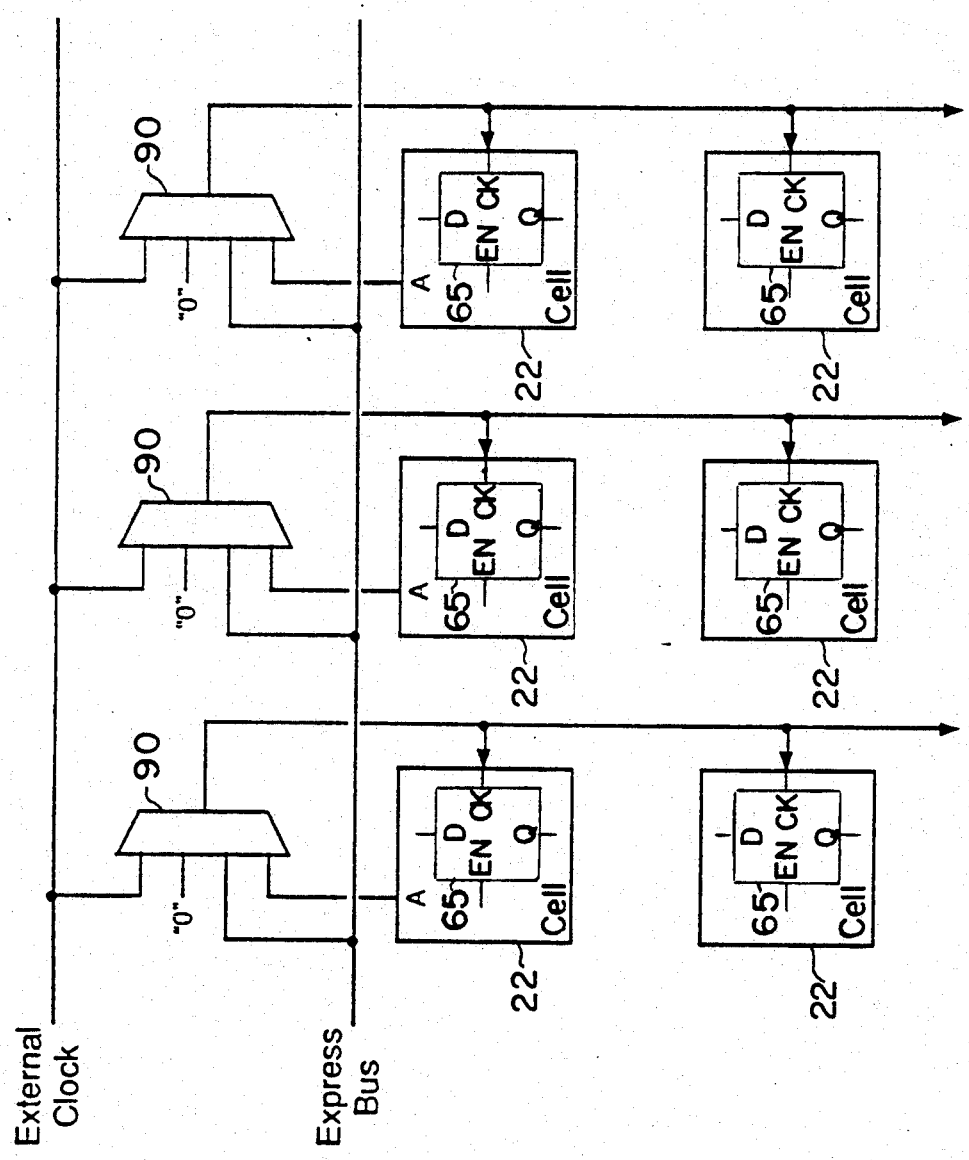
FIG. 10 is a block diagram depicting a clock distribution network according to the present invention.

Preferably, logic unit 56 comprises a NAND gate 61, an XOR gate 63, a flip-flop 65 and two four-to-one multiplexers 67, 69. The operation of logic unit 56 is determined by the state of multiplexers 67, 69, which are controlled in tandem via the two configuration bits. FIGS. 4A-D illustrate the four configurations (or states) in which the logic unit may be placed. More specifically, FIG. 4A illustrates a first configuration, wherein the four "A" outputs are logically connected to a single selected "A" input and the four "B" outputs are logically connected to a single selected "B" input. FIG. 4B illustrates a second configuration, wherein the selected "A" input is logically connected to the four "B" outputs and the selected "B" input is logically connected to the four "A" outputs. FIG. 4C illustrates a third configuration in which a logical NAND function and a logical exclusive OR function are implemented by the logic unit 56. The logical NAND of the selected "A" input and the selected "B" input is provided on the four "A" outputs. The logical exclusive OR of the selected "A" input and the selected "B" input is provided on the four "B" outputs. Finally, FIG. 4D illustrates the implementation of a D-type flip-flop. In this configuration, the signal on the selected "B" input is applied to the enable input of the flip-flop to control whether the flip-flop maintains its previous state or reads in data supplied via the selected "A" input lead. The output of the flip-flop is provided on the four "A" outputs. A logical "1" (or high signal) is provided on the four "B" outputs. As shown in FIG. 10 below, each D flip-flop also has a clock input which controls the timing of changes in the state of the flip-flop.

Figure 5:
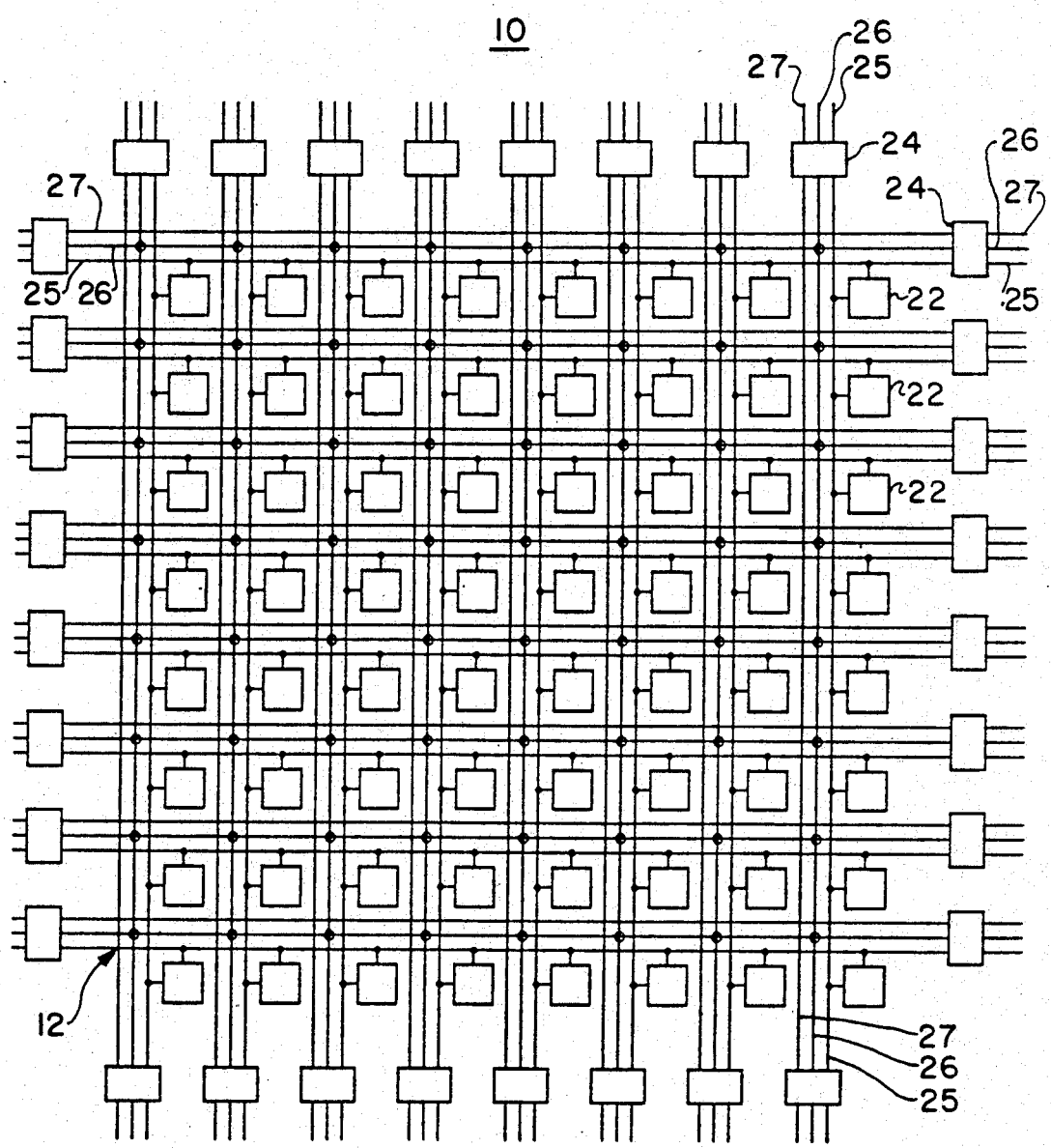
FIG. 5 is a diagrammatic illustration depicting further details of the bus network superimposed on an array of cells according to the present invention.

FIG. 5 illustrates the connection of the bus network of the present invention to the cells of the array 10 (the direct connections between the cells have been omitted for clarity). One local bus 25, one turning bus 26 and one express bus 27 are provided for each row and each column of the array.

Repeaters 24 partition each bus into bus segments. Each bus of a given row or column of the array is connected to a repeater 24 at every "n" consecutive cells with the result that the array is partitioned into n×n blocks of cells 22. For example, as shown in FIGS. 1 and 5, repeaters 24 are positioned so as to span eight consecutive cells 22, thereby forming an 8×8 block of cells. As suggested in FIG. 5, this arrangement is repeated indefinitely to form arrays of whatever size is desired. Note, however, that the direct connections illustrated in FIG. 2 are continuous throughout the array and are not disrupted by the repeaters or the bus network.

Figure 6:
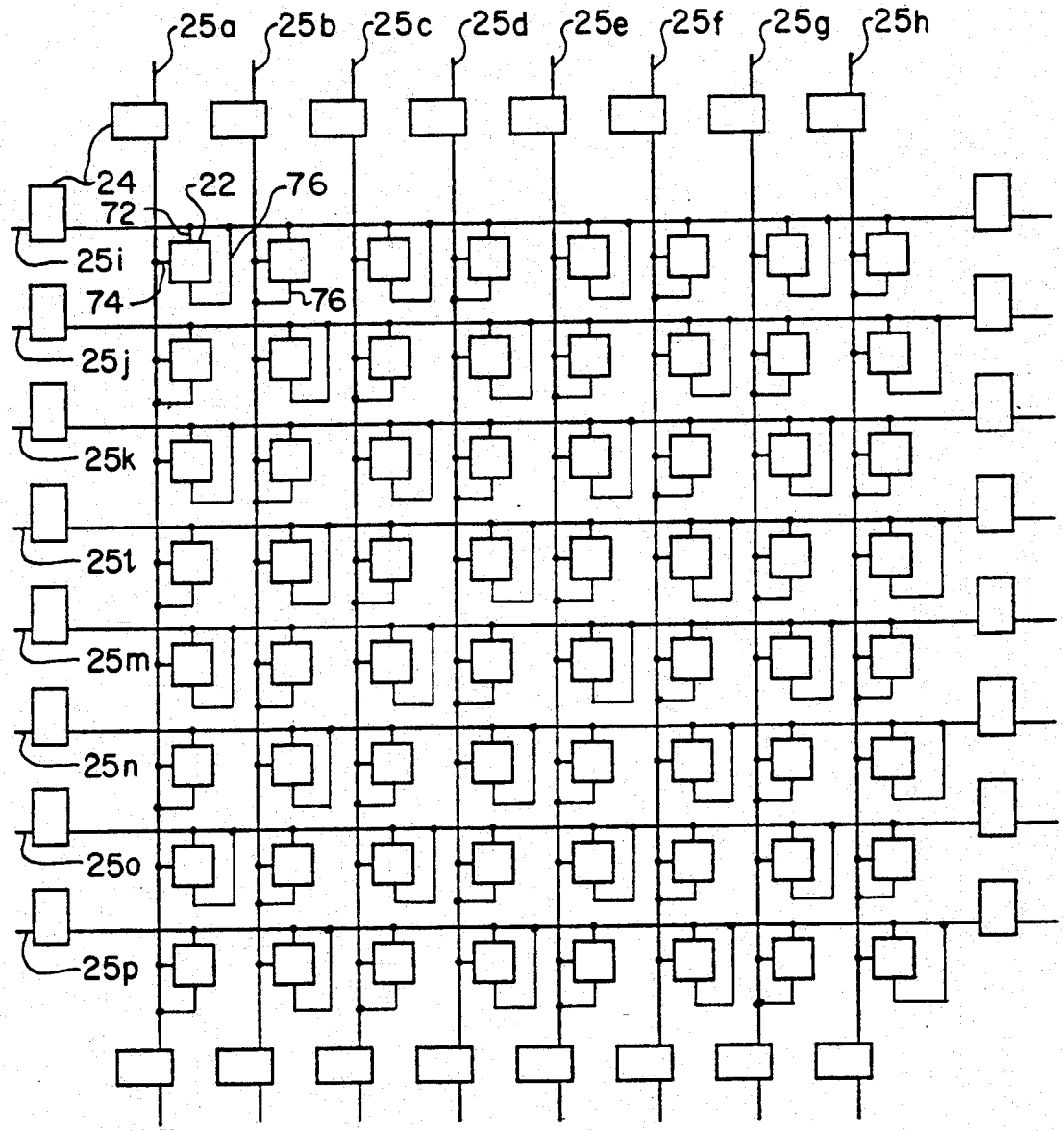
FIG. 6 is a diagrammatic illustration of the interconnection scheme between the array of FIG. 2 and local bus segments of the bus network.

FIG. 6 depicts the interconnection between cells 22 and the local buses of the bus network for an 8×8 block of cells. As shown in FIG. 6, the bus network comprises eight vertical local bus segments 25a-25h and eight horizontal bus segments 25i-25p. Each local bus segment 25a-25p spans eight consecutive cells. As shown in FIG. 6, leads 72, 74 provide inputs to each cell 22 from its associated horizontal and vertical local bus. However, cell 22 can only transmit data via a lead 76 to one of the horizontal or vertical buses depending on the location of the cell 22 within the array. In particular, a checkerboard pattern is used to determine whether a given cell transmits data to a horizontal bus or a vertical bus. Thus, if a given cell 22 transmits data to a horizontal bus, then the four cells 22 immediately adjacent to that cell, transmit data to the vertical local bus, and vice versa. Illustratively, the cell 22 in the upper left corner of the array transmits data to its associated horizontal local bus; and the other cells alternate their connections in the checkerboard pattern.

As shown in FIG. 3, leads 72, 74 from the horizontal and vertical buses are connected to each cell 22 through a horizontal local bus input 82 and a vertical local bus input 84 of the six-to-one multiplexer 54. Data is transmitted from the cell to the local bus segment by means of driver 86, which is connected to the "A" output of each cell 22.

Driver 86 is controlled via two input lines 88, 89 to provide a tri-state or open-collector function. The tri-state function, which is independently programmable for each cell via a configuration bit, allows driver 86 to be electrically disconnected from the local bus when the cell is not used to transmit to the local bus.

The open-collector function indicates to a particular cell whether any other cells are currently driving the same local bus segment. In the event a local bus segment is unused (i.e., no drivers are transmitting to the local bus segment), the open-collector capability is turned on and the local bus segment is pulled high through a passive pull-up resistor. Thus, any unused local bus segment provides a logical "1" to any cell reading the bus segment. If only one cell is transmitting to a given local bus segment, the open-collector function of driver 86 of all cells capable of driving that bus segment is off, and the driver of the transmitting cell can output either an active "1" or active "0". If more than one cell is driving the same local bus segment, the open-collector function of the drivers of all the cells capable of driving that bus segment are turned on to provide a wired-AND function. More specifically, if any one of the outputs of the cells driving the local bus segment is a logical "0", then the bus segment is pulled low, thereby providing a logical "0" to any cell reading the bus segment.

Figure 7:
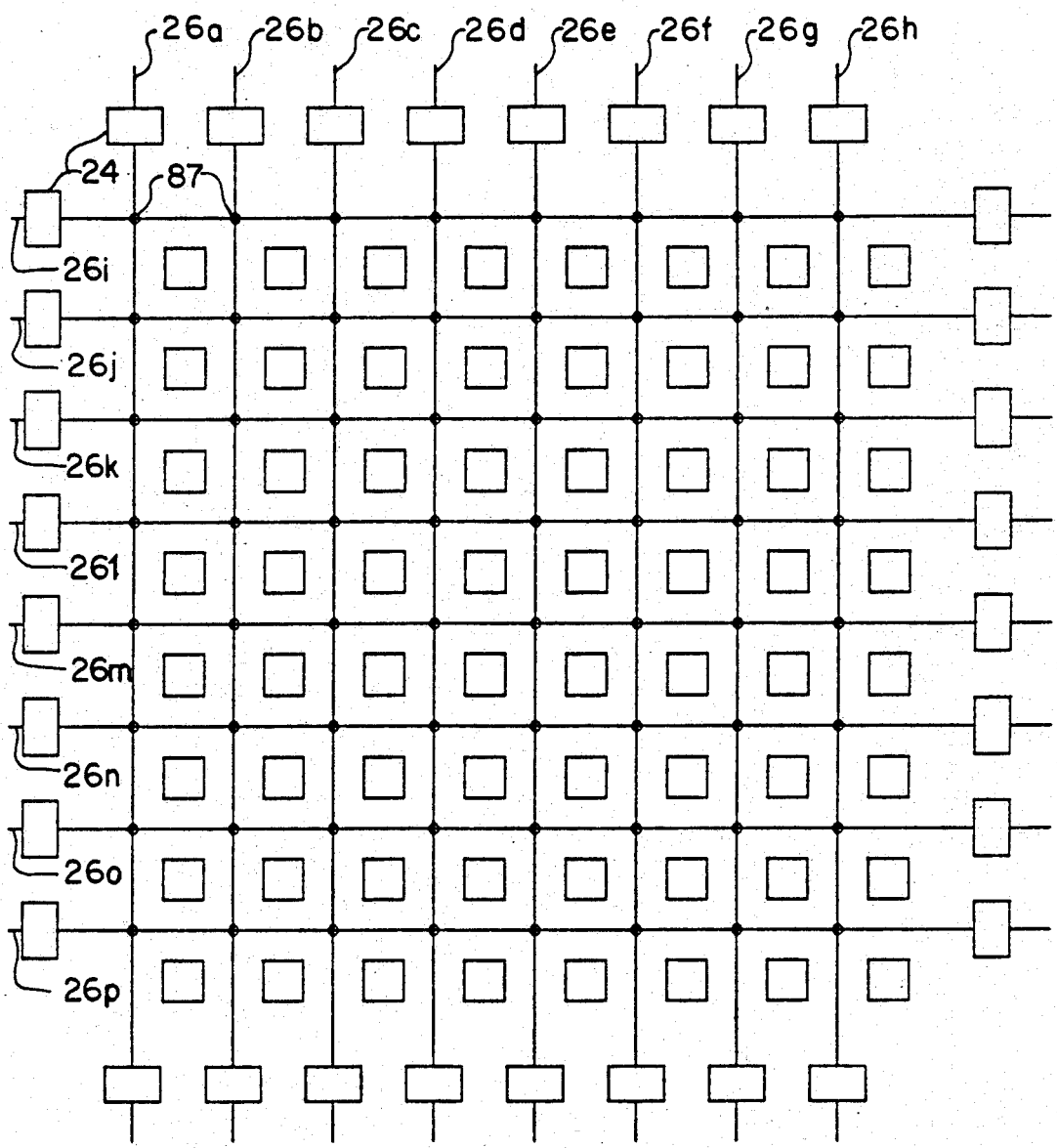
FIG. 7 is a diagrammatic illustration of the interconnection scheme between the array of FIG. 2 and turning bus segments of the bus network.

FIG. 7 depicts the connection scheme for the turning buses of the bus network for an 8×8 block of cells 22. These buses provide connections between the horizontal and vertical buses. Similar to the local bus segments there are sixteen turning bus segments 26a-26p associated with an 8×8 block of cells, eight turning bus segments 26a-26h running vertically and eight turning bus segments 26i-26p running horizontally. Each turning bus segment traverses eight orthogonal turning bus segments for an 8×8 block of cells and is connected to the eight orthogonal turning bus segments through a programmable connection that is schematically represented by the circle 87 at the intersection of each pair of orthogonal bus segments. Illustratively, the connection can be effected by a pass transistor controlled by a configuration bit that is provided to the transistor by a control signal line (not shown) from a configuration control (not shown). These connections allow data transmitted on a horizontal bus to be routed to a bus transmitting data in the vertical direction, and vice versa, thereby providing for 90° turns within the bus network.

Figure 8:
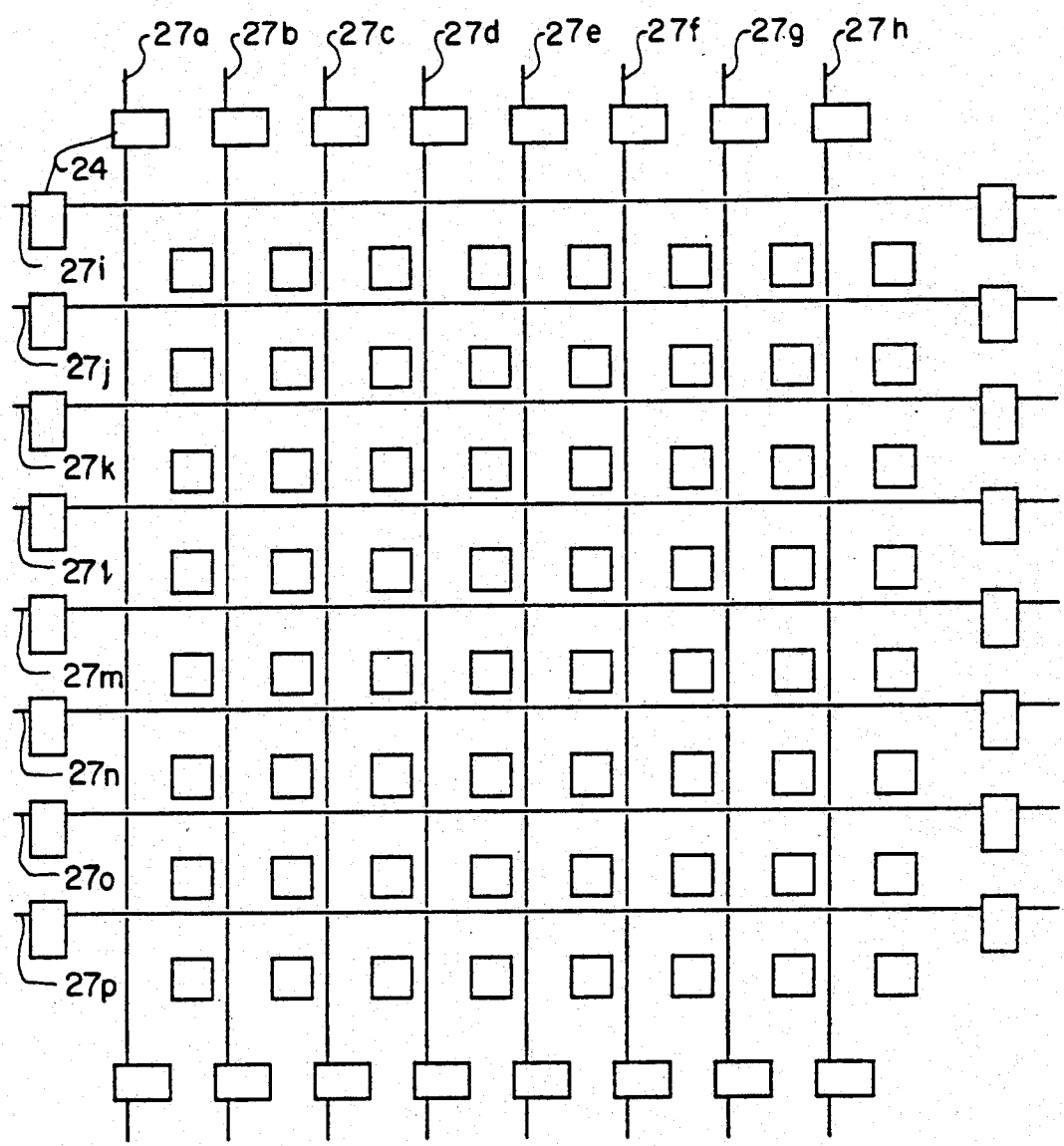
FIG. 8 is a diagrammatic illustration of the interconnection scheme between the array of FIG. 2 and express bus segments of the bus network.

FIG. 8 illustrates the connection scheme for the express buses of the bus network for an 8×8 block of cells 22. As was the case for the local and turning bus segments, there are 16 express bus segments 27a-27p for an 8×8 block of cells. However, unlike the local or turning bus segments, the express bus segments are connected solely to the repeaters 24. Thus, an express bus segment is the fastest means provided for transmitting data between two repeaters of a given row or column.

Repeaters 24 connect the bus segments of one n×n block of cells to the bus segments of the adjacent n×n block of cells. Each repeater 24 is programmable so as to allow any one of the three bus segments connected to ports on one side of the repeater to be connected to any one of the three bus segments connected to ports on the other side of the repeater. Thus, each repeater has the functionality of a 3×3 crossbar switch. In particular, a bus segment connected to one side of the repeater has four connection options with the opposite side of the repeater. For example, a local bus segment connected to one side of a repeater can be connected to either the local bus, the turn bus, or the express bus connected to the other side, or it can be terminated (i.e. the local bus connected to one side of the prepeater is not connected to any bus on the other side).

Figure 9:
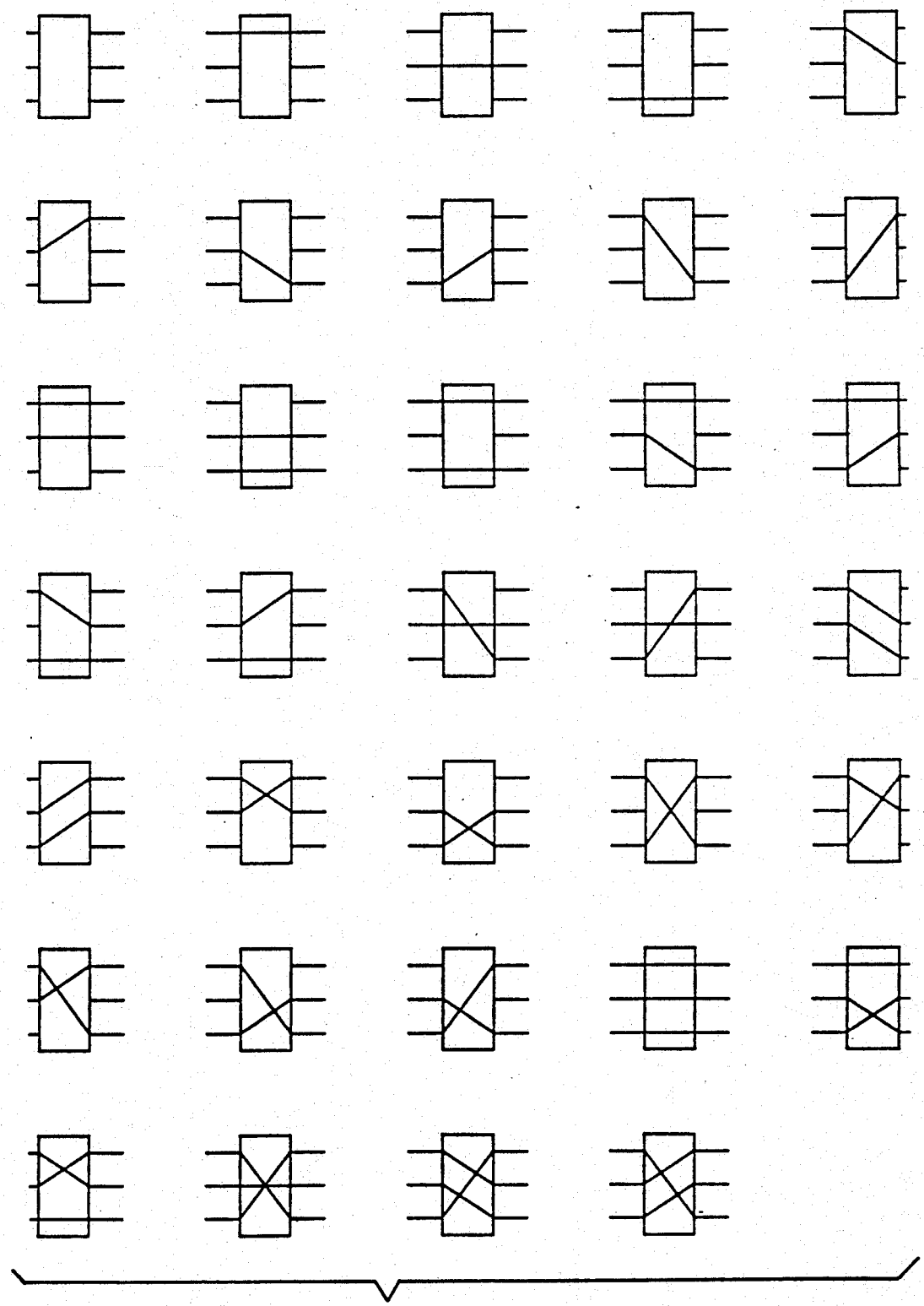
FIG. 9 is a diagrammatic illustration of a set of connections that can be implemented by a repeater of the bus network.

FIG. 9 illustrates the various connections that can be made between the ports of the repeater. As will be appreciated by those skilled in the art, numerous devices can be used to implement such connections and numerous other connection arrangements are possible.

Another function of each repeater is to provide signal regeneration. Illustratively, this is accomplished by providing a driver for each bus line. As a result, each repeater connection is unidirectional. Advantageously, the direction of signal flow for each repeater connection is programmable.

The array of the present invention also provides a clock distribution network for the distribution of clock signals to the D-type flip-flops 65 in the cells 22 of the array. The clock distribution network is partitioned by column so as to provide independent timing signals to each column of cells of the array. FIG. 10 depicts a clock distribution network comprising one multiplexer 90 for each column of the basic array. Each multiplexer 90 has four inputs and one output. The four inputs to the multiplexer are: an external clock, a logical constant, the express bus adjacent to the clock distribution network and the "A" output of the cell at the head of the column. The output of the multiplexer of a given column provides the clock signal to D-type flip-flop 65 of each cell 22 of the given column.

In response to two configuration bits, each multiplexer selects a signal from one of its four inputs and provides such signal as a clock signal to each cell in its column. The external clock input allows an external timing signal to be connected to any or all the columns of the array. The logical constant input can be used to provide a logical "O" to columns containing no registers so as to reduce power dissipation. The express bus input can provide a secondary clock to multiple columns when the external clock line is used as a primary clock. The fourth input, the "A" output, can provide a clock signal to a single column of cells.

Figure 11:
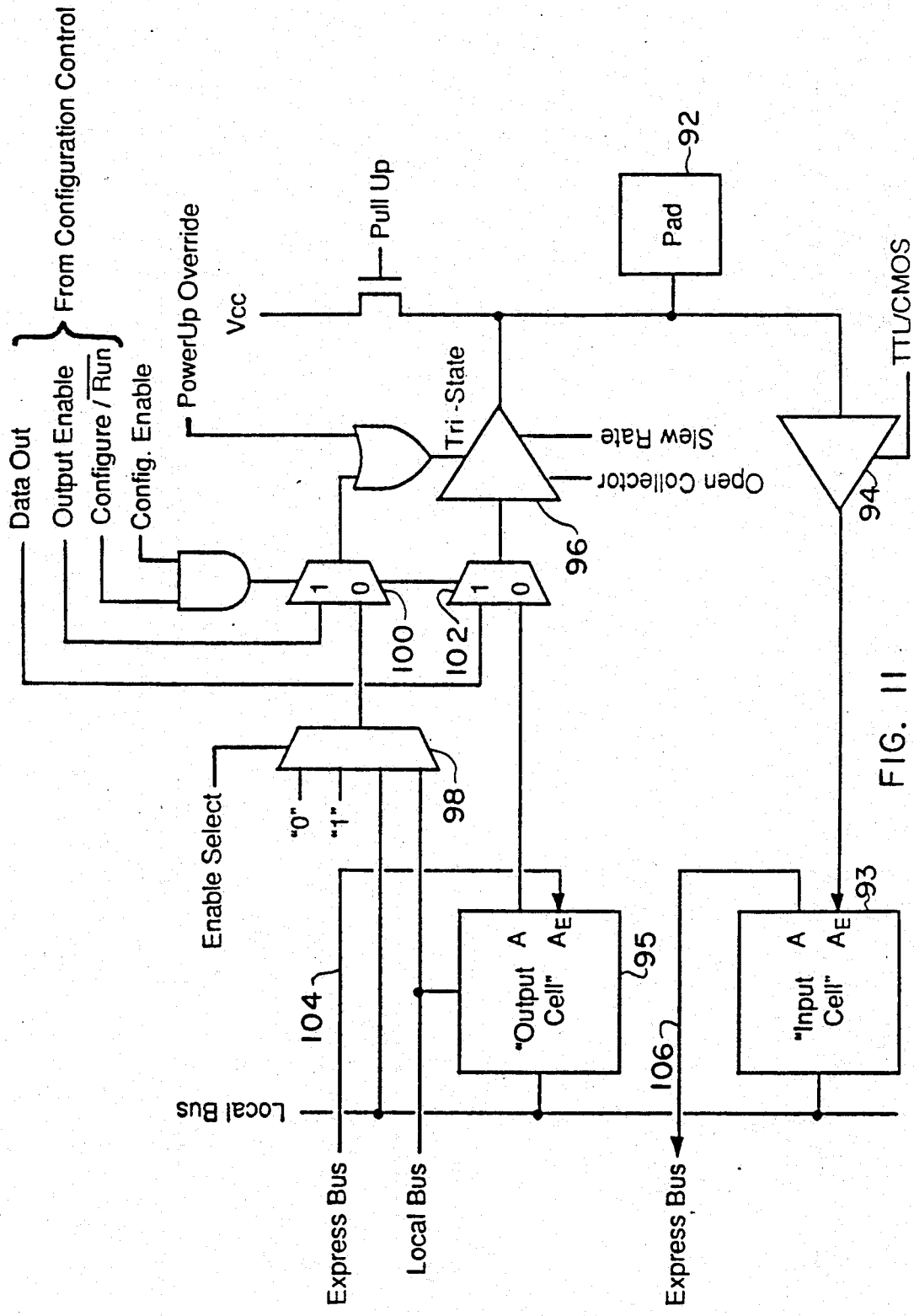
FIG. 11 is a block diagram depicting the interface between the array of the present invention and an input/output port.

FIG. 11 is a block diagram of the interface between the array and an input/output port 92, hereinafter referred to as an I/O pad. According to the present invention, for each I/O pad 92 the interface comprises an input buffer 94, an output buffer 96, a four-input multiplexer 98 and two two-input multiplexers 100, 102. Additionally, there are two adjacent cells 22 on the perimeter of the basic array dedicated to each I/O pad, one cell being dedicated as the "input" cell 93 and the other as the "output" cell 95.

As shown in FIG. 11, the output buffer 96 and input buffer 94 are both connected to the I/O pad 92. The input buffer 94 drives the input cell 93 through the edge-facing "A" input of the input cell. The edge-facing "A" output of the output cell 95 is connected to the output buffer 96 via two-to-one multiplexer 102.

The interface logic is controlled via programmable configuration bits. For example, the threshold level of the input buffer 94 is selectable to either TTL or CMOS and the slew rate of the output buffer is variable. Other selectable functions include an open-collector function on the output buffer, the enabling of a pull-up transistor on the I/O pad to prevent unused I/O pads from floating, and a global override so as to tri-state all output buffers at power up.

The output buffer 96 is programmable to one of two states: a "CONFIGURE" mode or a "RUN" mode. In the CONFIGURE mode, a control signal providing configuration data is connected to the output buffer 96 via multiplexer 102 and a control signal is connected to the tri-state function of output buffer 96 via multiplexer 100. In the RUN mode, the A output of the output cell 95 is connected to the output buffer 96 via multiplexer 102 and a control signal is connected to the tri-state function of the output buffer 96 via multiplexers 98, 100.

Two configuration bits control multiplexer 98 to select one of four signals for controlling the tri-state function of the output buffer 96. One of the four control signals is a logical "0", which turns the tri-state function of the output buffer 96 off, thereby allowing the output buffer to transmit to the I/O pad 92 (i.e., I/O pad can function only as an output port). A second control signal is a logical "1", which turns the tri-state function of the output buffer 96 on, thereby electrically disconnecting the output buffer 96 from the I/O pad 92 (i.e., I/O pad can function only as an input port). The third and fourth control signals are the signals transmitted on the output cell's 95 associated local vertical and horizontal bus. The signals transmitted on the bus are either a logical high or logical low and function to control the I/O pad as described above.

Finally, each input cell 93 and each output cell 95 associated with an I/O pad 92 are connected directly to express buses. As shown in FIG. 11, the edge-facing A input of the output cell 95 and the edge-facing A output of the input cell 93 are connected to express buses 104, 106. These buses provide a rapid means of routing input/output signals into and out of the array.

The logic cells of the present invention make the array especially well-suited for register-intensive, arithmetic and logic applications. This is accomplished by the inclusion of a register and a half adder (XOR and NAND) in the logic unit of each cell. Any of the basic logic functions can be implemented by interconnecting multiple cells and repetitively performing the exclusive OR and NAND function. For example, to produce the logical AND, OR and NOR functions, each of three cells can be configured to the state shown in FIG. 4C, in which the "A" output of the first cell provides the logical NAND of the selected "A" and "B" inputs and the "B" output provides an exclusive OR function of the "A" and "B" inputs. The "A" and "B" outputs of the first cell are then applied to the "A" and "B" inputs of the second cell. The outputs of the second cell are connected to the third cell in a similar manner. For this interconnection arrangement, the outputs of the second cell provide an exclusive NOR function and a NOR function of the input signals of the first cell and the outputs of the third cell provide an AND function and an OR function of the inputs of the first cell.

From the foregoing description of the invention, numerous alterations, modifications and improvements will be readily apparent. Other connection schemes may be used in conjunction with the bus network. For example, an additional bus may be incorporated whereby, every third repeater is connected so as to form a super express bus. In addition, the cells of the present invention can be modified so as to implement different operations, or a different number of operations or to accommodate additional inputs or provide more outputs. Of particular interest, while the invention has been described in the context of a two dimensional array of cells in which connections are provided at each cell with its nearest-neighbor cells in both directions in two dimensions (i.e., to the North and South, to the East and West), this connection pattern can also be extended so as to provide connections to other nearest-neighbor cells in one or both directions in additional dimensions. In particular, for each additional dimension, each cell of the two dimensional array has an additional two neighboring cells and therefore must provide for an additional two A inputs and two B inputs, one A and one B input from each cell and an additional two A outputs and two B outputs, one A and one B output to each cell. Finally, although the cells of the preferred embodiment are conceptually located on a plane, it is possible to connect the cell inputs and outputs on one edge of the array to the inputs and outputs of the cells on the opposite edge of the array. For example, in a two dimensional array, connecting the cells on two opposite ends of the array results in an array that can be conceptually viewed as a toroid.

What is claimed is:

1. In a two dimensional array of logic cells, each cell except those at the edges of the array having four nearest neighbors so as to form rows and columns of said cells, a bus network for transmitting signals within the array comprising:

a local bus, a turning bus and an express bus provided for every row and column of the array formed by said cells, repeater means for driving said buses, said repeater means partitioning said buses of a given row or column so as to form bus segments, each bus segment spanning a plurality of said logic cells.

2. The apparatus of claim 1 wherein the repeater means forming the bus segments are aligned in rows and columns which partition said array of cells into rectangular blocks of said cells.

3. The apparatus of claim 1 wherein each local bus segment is connected to every cell spanned by that bus segment so as to provide an electrical connection between the cells and the bus network.

4. The apparatus of claim 1 wherein each turning bus segment provides an electrical connection to all orthogonal bus segments between a row of the array and a column of the array.

5. The apparatus of claim 1 wherein the express bus segment is connected solely to the two repeater means forming said express bus segment.

6. The apparatus of claim 1 wherein the repeater means is programmable to connect any bus connected to one side of the repeater means to any bus connected to one side of the repeater means to any bus connected to the other side of the repeater.

7. The apparatus of claim 1 wherein the repeater means provides electrical signal regeneration for each programmable connection.

8. The apparatus of claim 1 wherein the repeater means is programmable so as to select the electrical signal direction through the repeater means for a given bus connection.

9. A programmable logic array comprising:
a plurality of logic cells, wherein each cell except those at the edges of the array has four nearest neighbors, one to the left (or West), one to the right (or East), one above (or to the North) and one below (or to the South) so as to form an array in which said cells are aligned in rows and columns, and clock distribution means for providing independent timing signals to said logic cells, said clock distribution means comprising one multiplexer for each column of the array, each multiplexer having a plurality of inputs and one output, said output being connected to each logic cell in the given column.

10. The apparatus of claim 9 wherein said multiplexer in the clock distribution means has four inputs, a first input to said multiplexer being a constant logical signal, said second input coming from an external timing source, said third input coming from an express bus and said fourth input coming from the output of a logic cell.

11. The apparatus of claim 9 wherein the timing signal provided to the logic cells of a given column of the array is independent from the timing signal of any other column of the array.

* * * * *